(12) United States Patent
Gocho (10) Patent No.: US 6,258,654 B1
(45) Date of Patent: Jul. 10, 2001

(54) METHOD OF MANUFACTURING A SEMICONDUCTOR DEVICE

(75) Inventor: Tetsuo Gocho, Kanawaga (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/253,047

(22) Filed: Feb. 19, 1999

(30) Foreign Application Priority Data

Feb. 25, 1998 (JP) .................................................. 10-043081

(51) Int. Cl.⁷ .............................................. H01L 21/8242
(52) U.S. Cl. ........................................... 438/240; 257/296
(58) Field of Search ..................................... 438/197, 238, 438/239, 240, 253, 254, 259, 396, 397; 257/296, 297, 303

(56) References Cited

U.S. PATENT DOCUMENTS 6,043,118 * 3/2000 Suwanai et al. ...................... 438/253

* cited by examiner

Primary Examiner—David Nelms
Assistant Examiner—Quoc Hoang

(74) Attorney, Agent, or Firm—Sonnenschein Nath & Rosenthal (57) ABSTRACT

The manufacturing method uses a substrate body comprising a semiconductor substrate having a cell region (1) for forming a memory cell portion and a circuit region (2) for forming a peripheral circuit portion, in which a diffusion layer is formed to the semiconductor substrate in the circuit region (2) and a first interlayer insulation film is formed on the semiconductor substrate, and comprises conducting a step of forming a peripheral circuit including a step of forming a connection hole through a first interlayer insulation film in the circuit region (2) so as to expose the diffusion layer at the bottom, a step of ion implanting impurities to the diffusion layer in the vicinity of the bottom of the connection hole and a step of conducting a heat treatment for activating the impurities introduced into the diffusion layer. Subsequently, a cell region processing step having a step of forming a capacitor on the substrate body in the cell region (1) is conducted.

A highly dielectric material is used for the material of the dielectric film of the capacitor, so that the capacity of the capacitor is not lowered even if the compensating diffusion layer is formed in the step of forming the peripheral circuit.

18 Claims, 4 Drawing Sheets

FIG. 1A (1) CELL REGION    (2) CIRCUIT REGION

(1) CELL REGION  (2) CIRCUIT REGION

(1) CELL REGION  (2) CIRCUIT REGION

FIG. 5

METHOD OF MANUFACTURING A SEMICONDUCTOR DEVICE

BACKGROUND OF THE INVENTION

1. Field of the Invention

The present invention relates to a method of manufacturing a semiconductor device and more particularly to a method of manufacturing a semiconductor device applied, for example, to manufacture of semiconductor integrated circuits having memory devices which are highly refined and integrated, or semiconductor integrated circuits in which memory devices and logic devices are disposed together.

2. Description of the Related Art

In recent years, as semiconductor integrated circuits developed greatly for high integration degree and high performance, DRAMs have been known for instance. Since a memory cell portion containing one bit of information can be formed as an assembly of a less number of devices, namely, one transistor and one capacitor in DRAM, it is suitable to increase the capacity and has played a leading role in highly advanced refining processes.

Memory capacity of DRAM has been increased by as much as four times in about three years. Further, the chip area has been increased by 1.5 times on every generation. However, the memory cell area has been reduced to ⅓. Meanwhile, for enabling reading by a sensing amplifier and in order to prevent occurrence of α-ray induced soft errors, an identical storage capacity is demanded for a charge retaining capacitor even if the memory cell area is reduced as described above, for example, it is necessary to ensure the value of from 20 to 30 fF. Then, it has become necessary to increase the capacitor area or use a film of high specific dielectric constant as a dielectric film of the capacitor.

Recently, tantalum oxide has been expected as a film of high specific dielectric constant. The film has an extremely higher specific dielectric constant of 23 compared with the specific dielectric constant of 7.5 of a silicon nitride film used mainly as the dielectric film for the capacitor so far.

Figure 4:
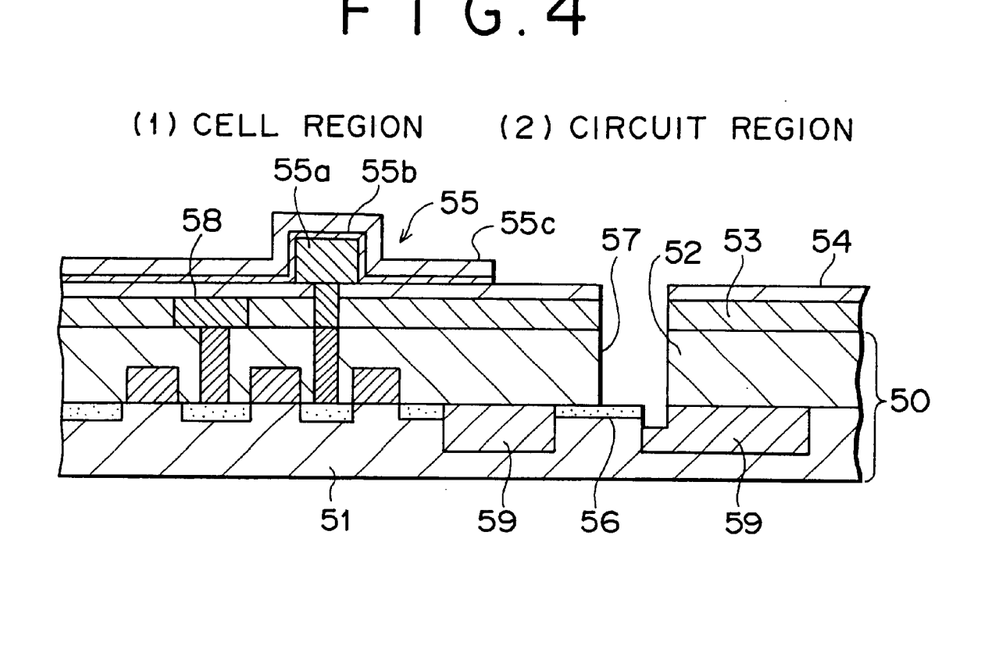
FIG. 4 is a cross sectional view for a main portion showing an example of a method of manufacturing a semiconductor device in the prior art.

By the way, in the manufacture of an usual DRAM, as shown in FIG. 4, a substrate body 50 having an interlayer insulation film 52 formed on a semiconductor substrate 51 having a cell region (1) for forming a memory cell portion and a circuit region (2) for forming a peripheral circuit portion is used. When the memory portion and the peripheral circuit portion are formed to the substrate body 50, a step of forming a capacitor 55 comprising a lower electrode 55a, a dielectric film 55b and an upper electrode 55c is carried out and then a step of forming the peripheral circuit to the circuit region (2) is conducted. This is because the step of forming the capacitor 55 includes a heat treatment step at a higher temperature than that in the step of forming the peripheral circuit and, accordingly, if the peripheral circuit is formed previously, a disadvantage is caused to the peripheral circuit portion by the heat treatment step in the subsequent step of forming the capacitor 55.

For instance, in the step of forming the peripheral circuit, a connection hole 57 for connecting a diffusion layer 56 formed on a semiconductor substrate 51 and a wiring formed on the substrate body 50 is formed through interlayer insulation films 52, 53 and 54 on the semiconductor substrate 51 of the circuit region (2) till the hole reaches the diffusion layer 56. Subsequently, a step of burying tungsten by way of a barrier metal layer in the connection hole 57 thereby forming a tungsten plug for joining with the diffusion layer 56 is conducted.

Accordingly, when the tungsten plug is formed by conducting the step of forming the peripheral circuit before the step of forming the capacitor 55, a heat treatment for activating impurities in a polysilicone film forming the lower electrode 55a in the step of forming the capacitor 55 results in a phenomenon that the barrier metal layer of the tungsten plug penetrates the diffusion layer 56 to reach the semiconductor substrate 51. As a result, junction leak is caused at a joined portion between the tungsten plug and the diffusion layer 56. Therefore, the step of forming the peripheral circuit in the circuit region (2) is conducted after the step of forming the capacitor 55 in the cell region (1). The step of forming a bit line 58 on the substrate body 50 in the cell region (1) is connected before the step of forming the peripheral circuit.

Further, when the connection hole 57 is formed to the interlayer insulation films 52, 53 and 54 of the circuit region (2) in the step of forming the tungsten plug in the step of forming the peripheral circuit, a photolithographic step and a drying etching step are used. However, misalignment may sometimes be caused upon conducting mask alignment relative to a device isolation region 59 comprising a silicone oxide film in the photolithographic step, for manufacturing a highly integrated DRAM as described above, to form the connection hole 57 in a state overlapped partially with the end of the device isolation region 59. In this case, the device isolation region 59 is engraved to expose the underlying semiconductor substrate 51 and, if it is left as it is, leak current is caused when a conductive material is buried into the connection hole 57 in the subsequent step.

Figure 5:
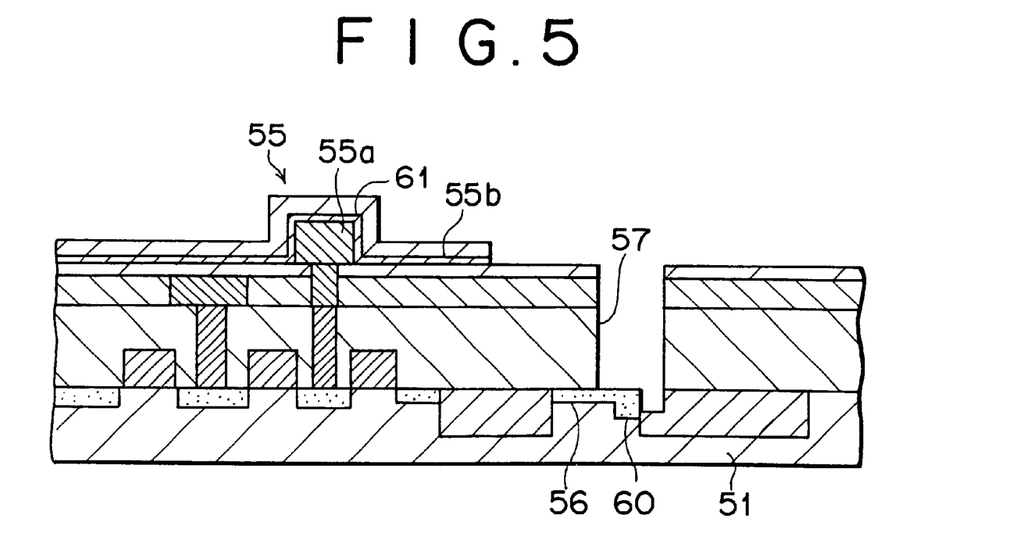
FIG. 5 is a cross sectional view for a main portion showing an another example of a method of manufacturing a semiconductor device in the prior art.

In view of the above, in recent years, as shown in FIG. 5, impurity ions are implanted through the connection hole 57 to the diffusion layer 56 exposed at the bottom of the connection hole 57 (contact compensating ion implantation), and then the implanted impurities are activated in the semiconductor substrate 51 by a heat treatment at a temperature higher than that for the formation of the polysilicon film, for example, at about 800° C., to form a compensating diffusion layer 60, thereby preventing occurrence of the leak current.

By the way, in the method of manufacturing the semiconductor device of the prior art, if the step of forming the compensating diffusion layer is introduced to the step of forming the peripheral circuit as described above, an activating heat treatment at a higher temperature is conducted in the step of forming the compensating diffusion layer after the step of forming the capacitor. Therefore, if a tantalum oxide film is used as the dielectric film in the step of forming the capacitor, tantalum oxide and the lower electrode of the capacitor are reacted by the activating heat treatment applied subsequently to result in a disadvantage that the lower electrode is oxidized to lower the effective capacity. For example, when polysilicon is used for the lower electrode of the capacitor, the polysilicon forms silicon oxide having a specific dielectric constant as low as 4 to lower the capacity.

For preventing oxidation of the polysilicon as the lower electrode upon activating heat treatment described above, it may be considered to interpose a silicon nitride film 61 between the lower electrode 55a and the dielectric film 55b comprising tantalum oxide for preventing oxidation of the polysilicon as shown in FIG. 5. However, since the specific dielectric constant of the silicon nitride film 61 is 7.5, lowering of the capacity is inevitable also in this case.

Further, it has been considered to use tungsten which can be formed at a lower temperature instead of polysilicon undergoing a heat treatment at high temperature as the material for forming the lower electrode of the capacitor. However, tungsten is also oxidized through the activating heat treatment at a high temperature in the step of forming the compensating diffusion layer described above to result in lowering of the capacity of the capacitor. In addition, since the oxides of tungsten is sublimating, tungsten is swollen to no more serve as the lower electrode.

From the foregoings, it has been demanded for the development of a technique for forming DRAM not resulting in the lowering of the capacity of the capacitor even when a film of a highly dielectric constant such as a tantalum oxide film is used as the dielectric film for the capacitor and even if a step of forming the compensating diffusion layer is conducted in the step of forming the peripheral circuit.

Further, the reading performance of DRAM is improved more as the resistance of a bit line as a path for electric charges is lower, but tungsten polycide $(WSi)_x$/poly-Si) which is not low resistance material is used as the material for forming the bit line since it is resistant to heat in the step of forming the compensating diffusion layer in the step of forming the peripheral circuit at present. As described previously, when tungsten having resistance lower than that of tungsten polyside is intended to be used as the material for forming the bit line, since the bit line is formed also prior to the step of forming the peripheral circuit as described above, it reacts with oxygen atoms in silicon oxide of the interlayer insulation film in contact with tungsten and gases evolved from the interlayer insulation films, during activating heat treatment in the step of forming the compensating diffusion layer, to also result in a problem of causing failure such as disconnection of the bit line. Accordingly, it has also been highly demanded for the development of a technique capable of lowering the resistance of the bit line without causing failure to the bit line.

SUMMARY OF THE INVENTION

For solving the foregoing subjects, the present invention provides a method of manufacturing a semiconductor device using a substrate body comprising a semiconductor substrate having a cell region for forming a memory cell portion and a circuit region for forming a peripheral circuit portion in which a diffusion layer is formed to the semiconductor substrate in the circuit region and an insulation film is formed on the semiconductor substrate, the method comprising:

a step of forming a peripheral circuit including
  a step of forming a connection hole to the insulation film in the circuit region for exposing the diffusion layer at the bottom;
  a step of ion implanting impurities to the diffusion layer in the vicinity of the connection hole; and
  a step of applying a heat treatment for activating the impurities introduced to the diffusion layer, and then comprising
  a step of processing the cell region having a step of forming a capacitor on the substrate body in the cell region.

In the step of processing the cell region, a step of forming a bit line on the substrate body in the cell region may be conducted along with the step of forming the capacitor.

In the present invention, since impurities are ion implanted into the diffusion layer exposed at the bottom of the connection hole in the circuit region and a heat treatment for activating the impurities is conducted in the step of forming the peripheral circuit, the compensating diffusion layer is formed on the semiconductor substrate in the circuit region. Then, since the step of processing the cell region having the step of forming the capacitor is conducted after the step of forming the peripheral circuit provided with the compensating diffusion layer, the thus formed capacitor does not undergo heat treatment at high temperature for forming the compensating diffusion layer. Accordingly, there may be a worry of lowering the capacity of the capacitor by the heat treatment at high temperature to the material forming the dielectric film in the step of forming the capacitor. However, even if a conduction portion having a high specific dielectric constant and to be joined with the diffusion region is formed in the connection hole in the circuit region in the previous step of forming the peripheral circuit, it is possible to use a dielectric material which can be formed at a temperature not causing junction leak at the joined portion. Further, even when the dielectric film is formed by using this dielectric material, the capacity of the capacitor formed is not lowered since high temperature treatment is not applied. Further, since the step of processing the cell region is conducted after the step of forming the peripheral circuit, a disadvantage may be caused by the heat treatment at high temperature for forming the compensating diffusion layer to the material forming the lower electrode of the capacitor since the cell region processing step is conducted after the step of forming the peripheral circuit, it is possible to use a conductive material that can be formed at a low temperature. Further, since the step of processing the cell region is conducted after the step of forming the peripheral circuit, even if the step of forming the bit line is conducted in the step of processing the cell region, no heat treatment at high temperature is applied for forming the compensating diffusion layer to the thus formed bit line. Accordingly, it is possible to use, as a material for forming the bit line, a conductive material which suffers from disadvantage by the heat treatment at high temperature but has lower resistance and can be formed at a temperature not causing junction leak to a joined portion between the diffusion layer and the conductive portion in the circuit region.

DESCRIPTION OF THE PREFERRED EMBODIMENTS

Figure 1A:
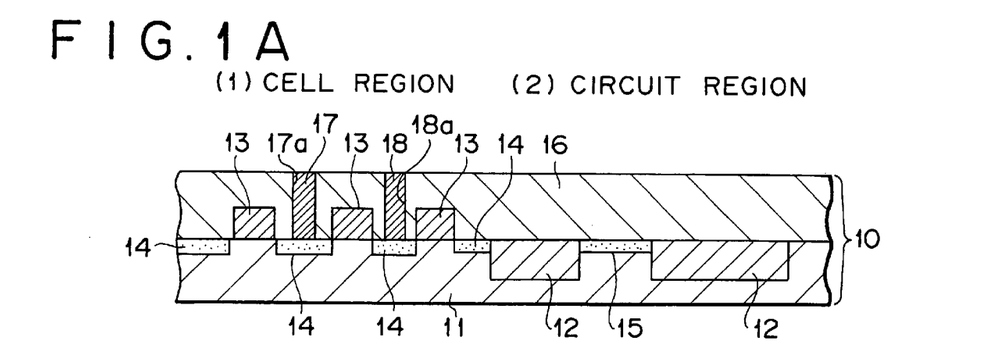
FIG. 1A to FIG. 1D are cross sectional views for a main portion (1) showing a preferred embodiment of a method of manufacturing a semiconductor device according to the present invention in the order of steps.
Figure 1B:
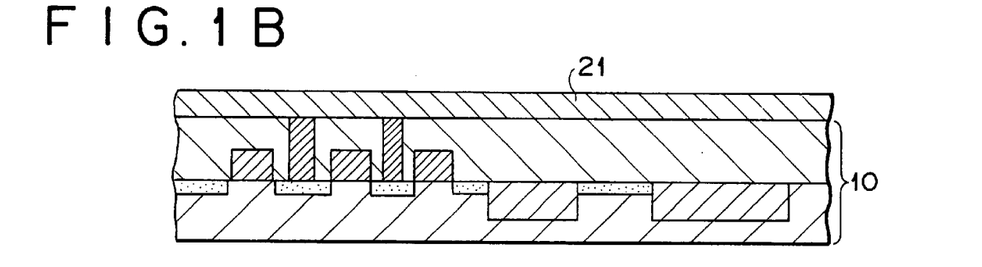
Figure 1C:
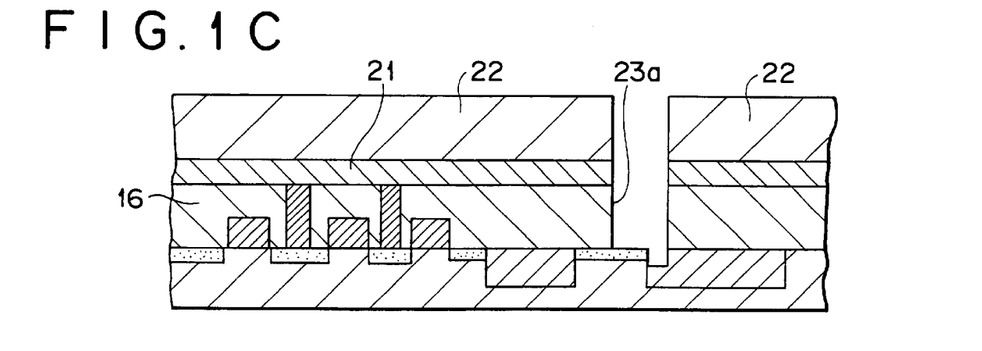

A method of manufacturing a semiconductor device according to the present invention is to be explained by way of a preferred embodiment thereof with reference to the accompanying drawings. FIG. 1A–FIG. 1D, FIG. 2A–FIG. 2D and FIG. 3A–FIG. 3C are cross sectional views showing main portions for a preferred embodiment of the present invention in the order of steps. In FIG. 1A–FIG. 1C, (1) denotes a cell region forming a memory cell portion of a DRAM and (2) denotes a circuit region forming a peripheral circuit portion comprising a logic portion.

In the method of manufacturing a semiconductor device according to this embodiment, a substrate body 10 shown in FIG. 1A is at first provided prior to the step of forming a peripheral circuit. That is, in a case of adopting an NMOSS transistor to a memory cell portion and a CMOS transistor comprising an NMOS transistor and a PMOS transistor for a peripheral circuit portion for instance, a device isolation region 12 is formed to a cell region (1) and a circuit region (2) of a semiconductor substrate 11 made of silicon by an existent device isolation technique, for electrically isolating regions for forming the PMOS transistor and the NMOS transistor. The device isolation region 12 is made, for example, of a silicon oxide film. Further, as the device isolation technique, there can be mentioned, for example, a trench device isolation technique or a LCOS device isolation technique.

Then, a step of forming a P well region (not illustrated) for forming an NMOS transistor N well region not illustrated for forming a PMOS transistor in the conductor substrate is conducted. In this step, a resist pattern opened only at the region for forming the P well is formed on the semiconductor substrate 11 by photolithography, ion implantation is conducted by using a resist pattern as a mask to form a P well region. In the ion implantation, boron ions ($B^+$) are used as the P type impurities and the spiking energy is set to 190 keV and at a dose rate of $6 \times 10^{12}$ cm$^2$. Then, the resist pattern is removed.

Successively, a resist pattern opened only at a region for forming an N well is formed on the semiconductor substrate 11 by photolithography and ion implantation is conducted using a resist pattern as a mask to form an N well region. In the ion implantation, phosphorous ions ($P^+$) are used as N type impurities, for example, and the spiking energy is set to 500 keV and the dose rate is set to $5 \times 10^{12}$/cm$^2$. Then, the resist pattern is removed.

Then, a gate insulation film comprising a silicon oxide film is formed, for example, by a thermal oxidation method (not illustrated) in a region for forming the PMOSS transistor and the NMOSS transistor of the semiconductor substrate 1. Then, a doped polysilicon film as a film material for the gate electrode is formed on the semiconductor substrate 11 in the cell region (1) and the circuit region (2), respectively, by a chemical vapor deposition process (hereinafter referred to as CVD). As an example, conditions forming a doped polysilicon film by employing CVD under a reduced pressure (hereinafter referred to as LP-CVD) are shown below.
Starting gas material: $SiH_4/Ph_3/He/N_2$
and flow rate 100 sccm/50 sccm/400 sccm/200 sccm
Atmospheric pressure: 70 Pa
Substrate temperature: 610° C.

Then, a tungsten silicide film is formed on the doped polysilicon film by a CVD process. An example of film-forming conditions in a case of employing an LP-CVD process as the CVD process is shown below.
Starting gas material $Wf_6/SiH_2Cl_2/Ar$
and flow rate: 2.5 sccm/150 sccm/100 sccm
Atmospheric pressure: 40 Pa
Substrate temperature: 680° C.

Then, a resist pattern is formed on the tungsten silicide film by lithography and, subsequently, dry etching is applied using the resist pattern as a mask to fabricate the tungsten silicide film and the doped polysilicon film in the shape of a gate electrode. Then, the resist pattern is removed to obtain a gate electrode 13 of a polycide structure comprising a polysilicon formed on the gate insulation film and the tungsten silicide film formed on the layer thereabove. An example of etching conditions when the drying etching is conducted in two steps with different conditions by using, for example, a microwave etcher is shown below. (First step) is for the etching conditions of the tungsten silicide film while (second step) is for the etching conditions of the polysilicon film.
(First step)
Etching gas and flow rate: $Cl_2/O_2$; 75 sccm/8 sccm
Atmospheric pressure: 0.4 Pa
Microwave power: 900 W
RF power: 60 W, 20 A/7 A
Substrate temperature: 20° C.
(Second step)
Etching gas and flow rate: $HBr/O_2$; 120 sccm/4 sccm
Atmospheric pressure: 1.0 Pa
Microwave power: 900 W
RF power: 40 W, 25 A/4 A
Substrate temperature: 20° C.

Then, the region for forming the PMOS transistor is covered with a resist film by photolithography, and ion implantation is conducted for forming an LDD diffusion layer in the region for forming the NMOS transistor. Then, the resist film is removed. In the same manner, the region for forming the NMOS transistor is covered with a resist film and ion implantation is conducted for forming an LDD diffusion layer in the region for forming the PMOS transistor. Then, the resist film is removed.

Then, a thin silicon oxide film (not illustrated) is formed on the semiconductor substrate 11 while covering the gate electrode. Successively, a polysilicon film is formed on the silicon oxide film, and the polysilicon film is etched back till the silicon oxide film is exposed by dry etching, thereby forming an LDD side wall (not illustrated on the side wall of the gate electrode. Examples of conditions for forming the silicon oxide film and examples of conditions for forming the polysilicon are shown below.
(Condition for forming silicon oxide film)
Starting gas and flow rate: TEOS $(Si(OC2H5)_4)/N_2$; 50 sccm/5 sccm.
Atmospheric pressure: 80 Pa
Substrate temperature: 720° C.
(Condition for forming polysilicon film)
Starting gas and flow rate: $SiH_4/Ne/N_2$; 100 sccm/400 sccm/200 sccm
Atmospheric pressure: 70 Pa
Substrate temperature: 610° C.

Then, a resist film is formed on the semiconductor substrate 11 while covering the regions for forming the PMOS transistors in the cell region (1) and the circuit region (2) by photolithography. Then, N type impurities are ion implanted into the region for forming the NMOS transistor in the circuit region (2) for forming a source/drain diffusion layer. Subsequently, the resist film is removed. In the same manner, a resist film is formed on the semiconductor substrate 11 while covering the region for forming the NMOS transistors in the cell region (1) and the circuit region (2). Then, ion implantations is conducted into the region for forming the PMOS transistor in the circuit region (2) for forming the source/drain diffusion layer. Subsequently, the resist film is removed.

Since the concentration of the diffusion layer in the cell region (1) may be lower than the concentration of the diffusion layer in the circuit region (2), the diffusion layer 14 for the cell region (1) is formed to the semiconductor substrate 11 only by the ion implantation for forming the LDD diffusion layer as described above.

Further, the diffusion layer 15 in the circuit region (2) is formed at a high concentration to the semiconductor substrate 11 by ion implantation for forming the LDD diffusion layer and ion implantation for forming the source/drain diffusion layer.

Then, the polysilicon film constituting the LDD side wall is removed by dry etching and, successively, a first interlayer insulation film 16 is formed on the semiconductor substrate 11 covering the gate electrode 13 by a CVD process. The first interlayer insulation film 16 constitutes the insulation film in the present invention, which is formed such that the surface is flat. Then, in the cell region (1), are formed a polysilicon plug 17 for connecting a bit line formed on the substrate body 10 and the diffusion layer 14, and a polysilicon plug 18 as a portion of a memory node contact portion for connecting the lower electrode of a capacitor and a diffusion layer 14 as described later.

Upon forming the polysilicon plugs 17 and 18, connection holes 17a and 18a reaching the diffusion layer 14 are formed at the position of forming the polysilicon plug 17 of the first interlayer insulation film 16 in the cell region (1). Subsequently, the resist film formed by the photolithography and used as the etching mask upon dry etching described above is removed.

Then, a doped polysilicon film is formed on the first interlayer insulation film 16 so as to bury the connection holes 17a and 18a by a CVD process. Then, the doped polysilicon film is removed till the location at which the surface of the first interlayer insulation film 16 is exposed, for example, by etching back to obtain the polysilicon plug comprising the doped polysilicon film remained in the connection hole 17a, and the polysilicon plug 18 comprising the coped polysilicon film remained in the connection hole 18a.

After forming the substrate body 10 shown in FIG. 1A as described above, a step of forming a peripheral circuit shown in FIG. 1B to FIG. 2A is conducted. At first, as shown in FIG. 1B, a second interlayer insulation film 21 is formed on the substrate body 10 by a CVD process. The second interlayer insulation film 21 is formed, for example, to a thickness of a bit line to be formed.

Then, as shown in FIG. 1C, a resist pattern 22 is formed on the second interlayer insulation film 21 by photolithography for forming a plug to be connected with the diffusion layer 15 in the circuit region (2). Subsequently, drain etching is conducted using the resist pattern 22 as a mask to form a connection hole 23a through the second interlayer insulation film 21 and the first interlayer insulation film 16 so as to expose the diffusion layer 15 at the bottom. The connection hole 23a constitutes the connection hole in the present invention. Then, the resist pattern 22 is removed.

An example of etching conditions in a case of conducting dry etching for forming the connection hole 23a by using, for example, a parallel plate etcher.
Etching gas and flow rate: $CHF_3/CF_4/Ar$: 40 sccm/400 sccm/600 sccm
Atmospheric pressure: 20 Pa
RF power: 1200 W (380 kHz)
Substrate temperature: 0° C.

Figure 1D:
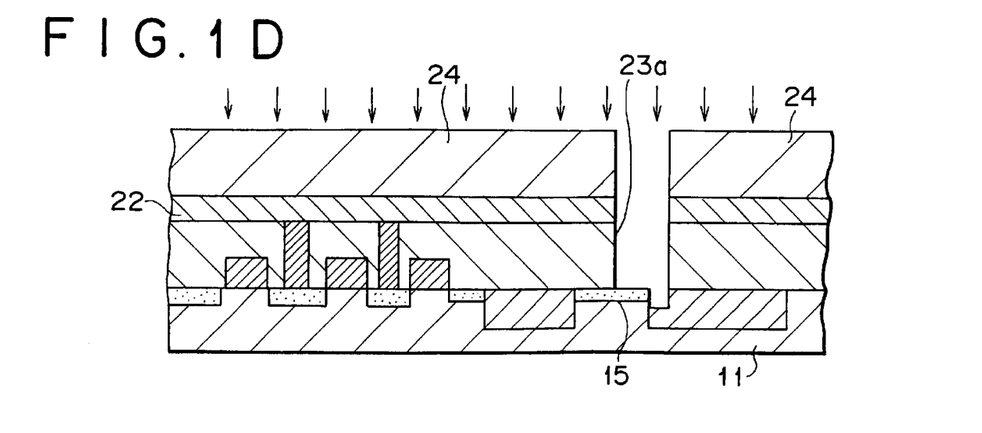

Then, as shown in FIG. 1D, a resist pattern 24 is formed by photolithography on the second interlayer insulation film 21 in which only the position for the P-type diffusion layer 15 for the insulation layer 15 in the circuit region (2) is opened. Then, P-type impurities are ion implanted to the P-type diffusion layer 15 near the bottom of the connection hole 23a through the connection hole 23a (contact compensating ion implantation).

Subsequently, the resist pattern 24 is removed. In the same manner, a resist pattern 24 is formed on the second interlayer insulation film 21 by photolithography in which only the position for the N-type diffusion layer for the diffusion layer 15 in the circuit region (2) is opened. Then, N-type impurities are ion implanted to the N-type diffusion layer 15 through the connection hole 23a (contact compensating ion implantation). Then, the resist pattern 24 is removed.

Figure 2A:
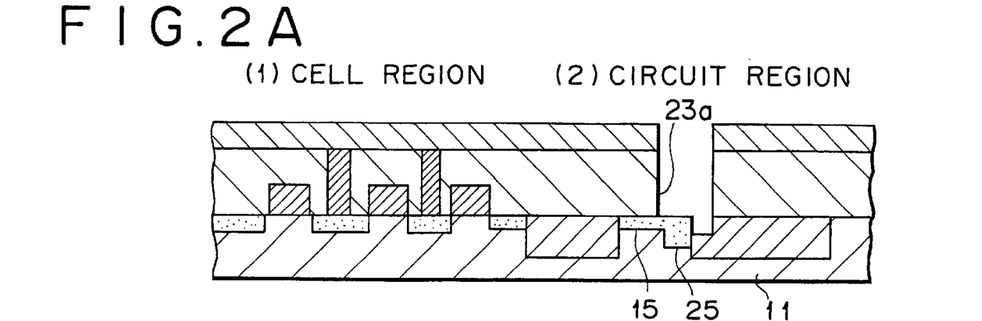
FIG. 2A to FIG. 2D are cross sectional views for a main portion (2) showing a preferred embodiment of a method of manufacturing a semiconductor device according to the present invent in the order of steps.

Then, heat treatment is conducted at a temperature by which the previously ion implanted impurities are activated in the semiconductor substrate 11 to obtain a compensating diffusion layer 25 in the semiconductor substrate 11 just below the connection hole 23a in the circuit region (2) as shown in FIG. 2A. This heat treatment may be conducted, for example, by using RTA (Rapid Thermal Annealing) under the conditions at about 1000° C. for about 10 sec or by using a furnace under the conditions at about 800° C. for about 10 min.

After conducting the step for forming the peripheral circuit as described above, a step of processing the cell region as shown in FIG. 2B to FIG. 3B is conducted. The cell region processing step comprises a step of forming a bit line on the substrate body 10 in the cell region (1) and a step of forming a capacitor. In this embodiment, a step of forming the bit line is conducted prior to the step of forming the capacitor as described later. Further, in the step of forming the bit line, a step to be conducted after the step of applying the heat treatment described above in the step for forming the peripheral circuit and before the step of forming the capacitor, namely, a step of forming a conductive portion to be joined with the diffusion layer 15 to the connection hole 23a of the circuit region (2) is also conducted together.

Figure 2B:
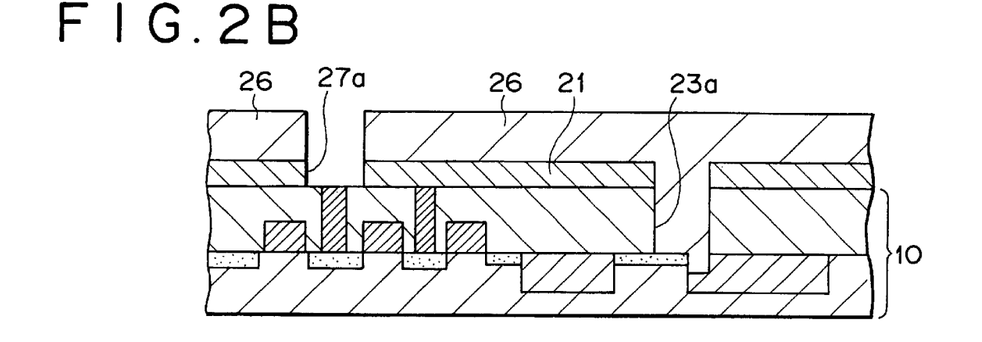
Figure 2C:
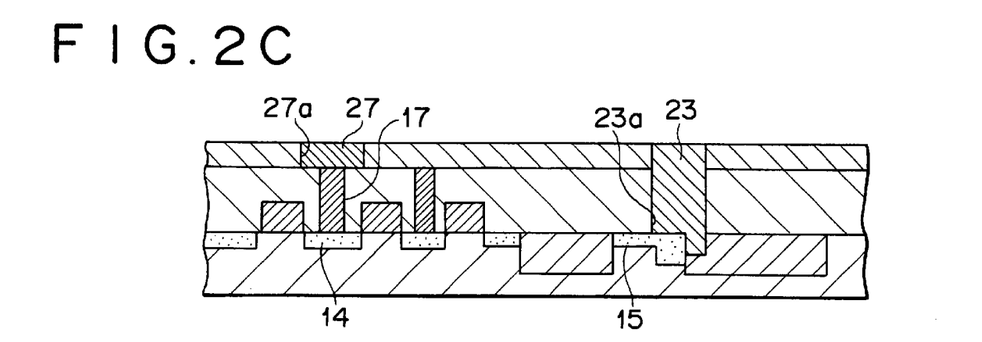

At first, in the step of forming the bit line, as shown in FIG. 2B, a resist pattern 26 is formed on the second interlayer insulation film 21 in which a position for forming the bit line of the cell region (1) is opened. Successively, the second insulation interlayer insulation film 21 is dry etched using the resist pattern 26 as a mask to form a groove 27a for forming the bit line. Further, the groove 27a is formed such that the groove passes through the silicon plug 17 formed to the substrate body 10 in the cell region (1) and the upper surface of the polysilicon plug 17 faces the bottom. Then, the resist pattern 26 is removed.

Then, a conductive material film (not illustrated) is formed on the second interlayer insulation film 21 while burying the groove 27a of the cell region (1) and the connection hole 23a of the circuit region (2). Successively, the conductive material film is removed till the surface of the second interlayer insulation film 21 is exposed while leaving the conductive material in the groove 27a and the connection hole 23a, for example, by a chemical/mechanical polishing method (hereinafter referred to as CMP method) or an etching back method.

This forms a bit line 27 in the cell region (1), the bit line comprising the conductive material film remained and buried in the groove 27a and connected by way of the polysilicon plug 17 to the diffusion layer 14. Further, a plug 23 comprising the conductive material film remained and buried in the connection hole 23a and joined with the diffusion layer 15 is formed in the circuit region (2). The plug 23 constitutes a conductive portion in the present invention.

A material that can be formed at a temperature lower than a temperature at which junction leak is caused at a junction portion between the diffusion layer 15 and the plug 23 of the circuit region 1 is used for the conductive material to be buried in the groove 27a and the connection hole 23a. For example, when the plug 27 is constituted by burying the connection hole 23a with the conductive material by way of the barrier metal, the temperature lower than the temperature causing junction leak at a joined portion between the diffusion layer 15 and the plug 23 in a case of constituting the plug 2 by burying the connection hole 23a, with the conductive material by way of the barrier metal layer is such a temperature lower than the temperature causing junction leak at the joined portion between the diffusion layer 15 and the barrier metal layer of the plug 23.

In a case of forming the barrier metal layer, for example, with titanium or a laminate film of titanium and titanium nitride, the temperature is, for example, a temperature lower than about 600° C., and tungsten that can be formed by a CVD process at a temperature lower than 600° C. is used as the conductive material in this embodiment. An example of conditions for forming the tungsten film by using the CVD process is shown below. Titanium, titanium nitride or the like can be formed into a film, for example, by a sputtering process at about 150° C. to 200° C.

Starting gas and flow rate: $WF_6/H_4/Ar$; =75 sccm/500 sccm/2800 sccm
Atmospheric pressure: 10640 Pa
Substrate temperature: 450° C.

An example of polishing conditions when the tungsten film is removed by the CMP method is shown below.
Number of rotation for polishing plate: 50 rpm
Number of rotation for wafer holding specimen stand: 40 rpm
Polishing pressure: 500 gf/cm$^2$
Polishing solution: ferric nitrate slurry
Temperature: 25° C.

Further, while this embodiment shows an example of using tungsten as the conductive material to be buried in the groove 20a and the connection hole 23a, any other material may be used so long as the material can be formed at a temperature lower than the temperature causing junction leak at the joined portion between the diffusion layer 15 and the plug 23 in the circuit region (2). As an example, copper that can be formed at a low temperature by an electrolytic plating method can be mentioned. Further, when copper is used for the conductive material, a barrier metal comprising, for example, titanium or titanium nitride may be interposed between the groove 27a and copper and between the connection hole 23a and copper. An example of conditions for forming the copper film by the electrolytic plating method is shown below.

Figure 2D:
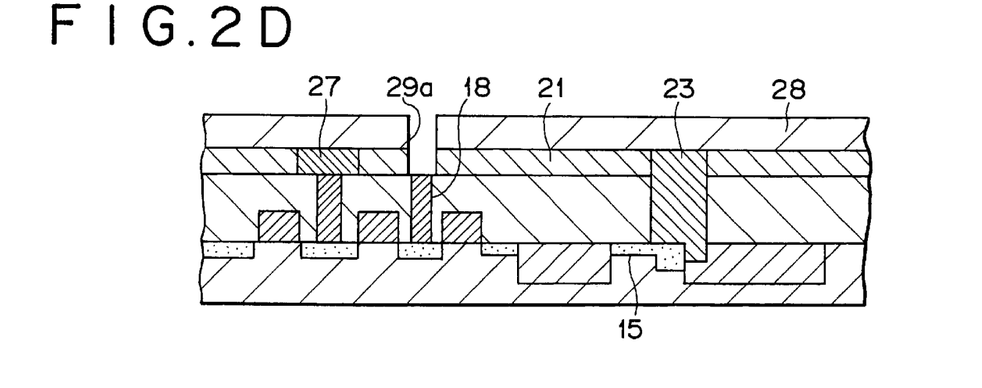

Chemical solution: $CuSO_4$; 68 g/litter $H_2SO_4$; 170 g/litter HCl; 70 ppm
Temperature: 25° C.
Current applied: +9 A After forming the bit line 27 and the plug 23 as described above a third insulation layer film 28 covering the upper surface of the bit line 27 and the plug 23 is formed on the second interlayer insulation film 21 as shown in FIG. 2D. The third interlayer insulation film 28 is a film for insulating the bit line 27 and the lower electrode of the capacitor to be formed on the third interlayer insulation film 28. An example of forming the third interlayer insulation film 28 with a silicon oxide film by a plasma CVD process using a parallel plate plasma CVD device is shown below.
Starting gas and flow rate: $TEOS/O_2$; 800 sccm/600 sccm
Atmospheric pressure: 1133.2 Pa
Substrate temperature: 400° C.
RF power: 700 W Then, as shown in FIG. 2D, a connection hole 29a is formed through the second interlayer insulation film 21 and the third interlayer insulation film 28 in the cell region (1). In this step, the connection hole 29a is formed so as to reach the polysilicon plug 18 to be a portion of the memory node contact portion. Then, the resist pattern formed on the third interlayer insulation film 23 upon photolithography described above and used as the etching mask upon dry etching is removed.

An example of etching conditions when dry etching for forming the connection hole 29a is conducted, for example, by using a parallel plate etcher is shown below.
Etching gas and flow rate: $CHF_3/CF_4/Ar$; 40 sccm/400 sccm/600 sccm
Atmospheric pressure: 20 Pa.
RF power: 1200 W (380 kHz)
Substrate temperature: 0° C.

Then, a step of forming the capacitor is conducted. At first, a conductive material film for forming the lower electrode of a capacitor is formed on the third interlayer insulation film 28 so as to bury the connection hole 29a. A conductive material that can be formed at a temperature lower than the temperature causing the junction leak at the joined portion between the plug 13 and the diffusion layer 15 formed previously in the circuit region (2) is used as the conductive material for the conductive material film. Another conductive material is also used in this embodiment that can maintain the capacity of the capacitor to be formed in the cell region processing step without lowering the capacity upon forming the dielectric film of the capacitor conducted after forming the lower electrode, and can maintain the capacity of the capacitor formed in the cell region processing step upon heat treatment after the cell region processing step.

Figure 3A:
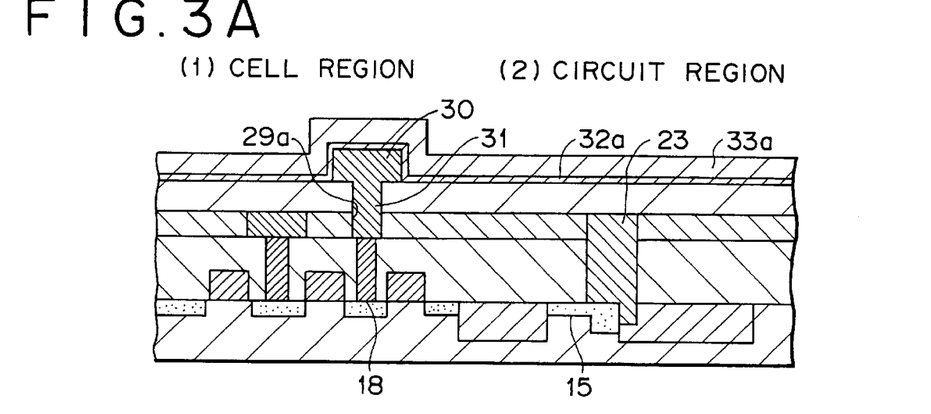
FIG. 3A to FIG. 3C are cross sectional views for a main portion (3) showing a preferred embodiment of a method of manufacturing a semiconductor device according to the present invention in the order of steps.

As the conductive material described above, a first conductive material and a second conductive material are used in this embodiment. After forming the first conductive film (not illustrated) on the third interlayer insulation film 28 so as to bury the connection hole 29a with the first conductive material, the first conductive material film is fabricated into the shape of the lower electrode by photolithography and dry etching to form a lower electrode main body. Then, a lower electrode 30 is formed by covering the surface of the lower electrode main body comprising the first conductive material with a film comprising the second conductive material (not illustrated) as shown in FIG. 3A. Further, since the connection hole 29a is buried with the first conductive material, a contact portion 31 constituting a memory node contact portion is formed together with the polysilicon plug 18.

In this case, a material that can be formed at a temperature lower than temperature causing the junction leak at the joined portion between the diffusion layer 15 and the plug 23 in the circuit region (2) is used as the first conductive (2) conductive material. Further, a conductive material that can be formed at a temperature lower than the temperature causing the junction leak to the joined portion described above, as well as can maintain the capacity of the capacitor formed in the cell region processing step while suppressing the oxidation at the surface of the lower electrode main body upon heat treatment after the formation of the dielectric film of the capacitor and the cell region processing step is used as the second conductive material.

The combination of the first conductive material and the second conductive material, in a case where the temperature lower than the temperature causing the junction leak at the joined portion between the diffusion layer 15 and the plug 23 in the circuit region (2) is defined, for example, to about 600° C. or lower, can include, for example, a combination comprising a first conductive material of tungsten and a second conductive material of tungsten nitride, a combination comprising a first conductive material of tungsten and a second conductive material of ruthenium and a combination comprising a first conductive material of copper and a second conductive material of tungsten nitride or copper nitride.

An example of conditions for forming the lower electrode by using tungsten for the first conductive material and using tungsten nitride for the second conductive material is shown below. In this example, a CVD process is used for forming the first conductive material film comprising tungsten. Then, the first conductive material film is fabricated by photolithography and dry etching using a parallel plate etcher to obtain the lower electrode main body. Further, the surface of the lower electrode main body is nitrided with plasmas by using a parallel plate plasma device or a high density plasma device, thereby forming a second conductive material film comprising tungsten nitride on the surface of the lower electrode main body.

(Condition for Forming Tungsten Film)
Starting gas and flow rate: $WF_6/H_2/Ar$; =75 sccm/500 sccm/2800 sccm
Atmospheric pressure: 10640 Pa
Substrate temperature: 450° C.
(Condition for Dry Etching)
Etching gas and flow rate: $SF_6/Ar/He$; 140 sccm/110 sccm/25 sccm
Atmospheric pressure: 32.0 Pa
RF power: 625 W
(Nitriding Condition by Parallel Plate Plasma Device)
Processing gas and flow rate: $N_2$; 1000 sccm
Atmospheric pressure: 1200 Pa
(Nitriding Condition by High Density Plasma Device)
Processing gas and flow rate: $N_2$; 1000 sccm
Atmospheric pressure: 0.2 Pa When ruthenium is used for the second conductive material, a ruthenium film can be formed at a low temperature, for example, of about 150° C. to 200° C. by a sputtering method. In a case of using the ruthenium film, the capacity of the capacitor can be maintained even if the surface of the lower electrode main body is oxidized upon heat treatment after the formation of the dielectric film of the capacitor and the cell region processing step.

After forming the lower electrode 30, a dielectric material film 32a for capacitor is formed on the third interlayer insulation film 28 so as to cover the lower electrode 30. In this state, the dielectric material film 32a is formed with a dielectric material that can be formed at a temperature lower than the temperature causing the junction leak at the joined portion between the diffusion layer 15 and the plug 23 in the circuit region (2). Further, it is preferred for the dielectric material in this embodiment to use a material having a higher specific dielectric constant than that of silicon nitride (specific dielectric constant =7.5) used so far as the dielectric material.

The dielectric material described above can include, for example, tantalum oxide ($Ta_2O_5$), iridium oxide ($IrO_2$), titanium oxide ($TiO_2$), cerium oxide ($CeO_2$), strontium titanate ($SrTiO_3$), barium strontium titanate $(Ba, Sr)TiO_3$ and lanthanum lead zirconium titanate $(La, Pb)(Zr, Ti)O_3$.

In this embodiment, tantalum oxide which can be formed at a temperature lower than the temperature causing the junction leak at the joined portion between the diffusion layer 15 and the plug 23 (for example at 600° C. or lower) is used. An example of conditions for forming tantalum oxide by the CVD is shown below. After forming the tantalum oxide film, a heat treatment is applied on a ozone atmosphere at 500° C. and not oxidized tantalum in the tantalum oxide film is oxidized to obtain a dielectric material film 32a.

Starting gas and flow rate: $Ta(OC_2H_5)/O_2/N_2$; =0.05 sccm/500 sccm/1000 sccm
Atmospheric pressure: 65 Pa
Substrate temperature: 480° C.

Then, a conductive material film 33a for forming an upper electrode is formed on the dielectric material film 32a. A material that can be formed at a temperature lower than the temperature causing the junction leak at the joined portion between the diffusion layer 15 and the plug 23 is used also for the conductive material 33a. For example, a titanium nitride film or a laminate film of a titanium nitride film and a metal material of low resistance can be mentioned. an example conditions for forming the conductive material 33a comprising titanium nitride by a sputtering method is shown below. The conductive material film 33a comprising the titanium nitride film may also be formed by a CVD process.

Sputtering gas and flow rate: $Ar/N_2$; 30 sccm/800 sccm
Atmospheric pressure: 0.4 Pa
DC power: 5 kW
Substrate temperature: 150° C.

Figure 3B:
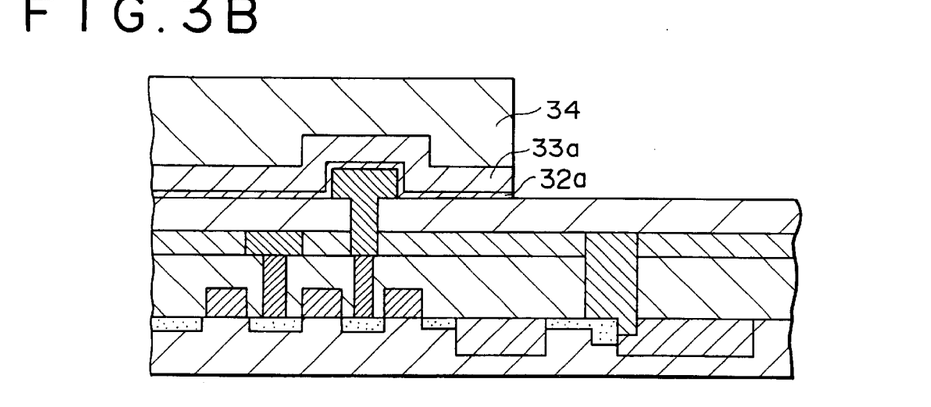
Figure 3C:
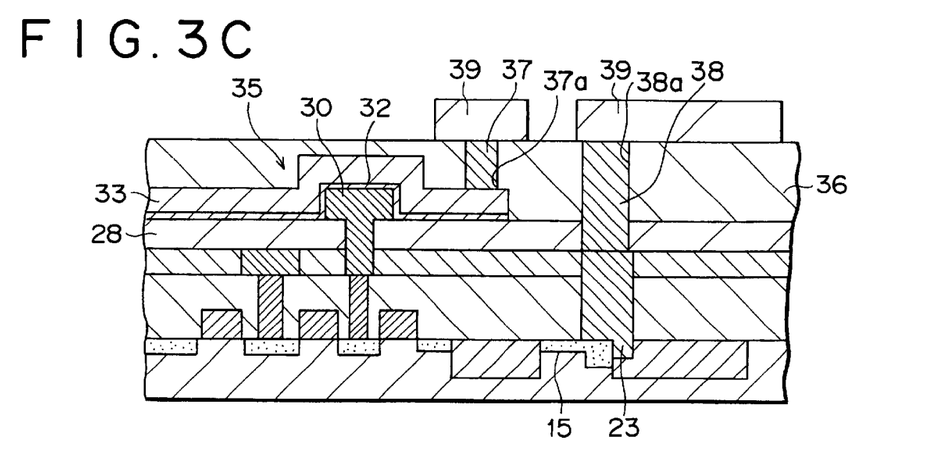

Then, as shown in FIG. 3B, a resist pattern 34 is formed on the conductive material 33a covering the capacitor portion in the cell region (1) by photolithography. Subsequently, the conductive material film 33a and the dielectric material film 32a formed on unnecessary portions such as in the circuit region (2) are removed by dry etching using the resist pattern 34 as a mask thereby forming the dielectric film 32 and the upper electrode 33 for the capacitor. Then, the resist pattern 34 is removed to form, a capacitor 35 for DRAM comprising the lower electrode 30, the dielectric film 32 and the upper electrode 33 as shown in FIG. 3C. The dry etching in this step is conducted under the following conditions using, for example, a magnetron etcher.

Etching gas and flow rate: $Cl_2/Ar/He$; 30 sccm/30 sccm/10 sccm
Atmospheric pressure: 2.5 Pa
RF power: 350 W
Magnetic field: 2E-3T Subsequently, wirings, etc. are formed for the cell region (1) and the circuit region (2) by usual wiring forming process. For instance, a fourth interlayer insulation film 36 comprising a silicon oxide film is formed on the third interlayer insulation film while covering the upper electrode 33, for example, by a CVD process. Then, a connection hole 37a reaching the upper electrode 33 is formed to the fourth interlayer insulation film 36 in the cell region (1), and a connection hole 38 reaching the upper surface of the plug 23 is formed through the fourth interlayer insulation film 36 and the third interlayer insulation film 28 in the circuit region (2) by photolithography and dry etching.

Then, a conductive material film comprising, for example, tungsten is formed on the fourth interlayer insulation film 36 so as to bury the inside of the connection holes 37a and 38a. Successively, a plug 37 comprising the conductive material remained in the connection hole 37a and a plug 38 comprising the conductive material film remained in the connection hole 38a are formed by etching back the conductive material film to a position for exposing the surface of the fourth interlayer insulation film 36 by dry etching.

Then, a wiring material film comprising aluminum or an alloy of aluminum and copper is formed on the fourth interlayer insulation film 36 by a sputtering method, and the wiring material film is fabricated by photolithography and dry etching, thereby forming a wiring 39 connected by way of the plug 37 with the upper electrode 33 and a wiring 39 connected by way of the plug 38 and the plug 23 with the diffusion layer 15 on the fourth interlayer insulation film 36. A semiconductor device comprising a DRAM having a memory cell portion and a peripheral circuit portion is manufactured by the steps described above.

As described above, in this embodiment, a step of forming the capacitor in the cell region processing step is conducted after the circuit region processing step of conducting ion implantation and the heat treatment for forming the compensating diffusion layer 25. Therefore, since the capacitor 35 is free from the effect caused by the heat treatment at high temperature for forming the compensating diffusion layer 25, the dielectric film 32 for the capacitor can be formed by using tantalum oxide having extremely high specific dielectric constant but resulting in lowering of the capacity of the capacitor by the heat treatment at high temperature. Accordingly, it is possible to manufacture a semiconductor device capable of ensuring the capacity of the capacitor that can effectively cope with α-ray induced soft errors even if the area of the memory cell is reduced, and it is possible to further increase the integration degree of the semiconductor device.

Further, since tantalum oxide is a material that can be formed at a temperature not causing the junction leak at the joined portion between the diffusion layer 15 and the plug 23 in the circuit region (2), deterioration of the electrical reliability due to the formation of the dielectric film 32 can also be prevented. Further, since the step for forming the capacitor 35 is conducted after the step of forming the peripheral circuit, tungsten not having heat resistance to the heat treatment at high temperature for forming the compensating diffusion layer 25 but capable of being formed at a low temperature can be used for the material for forming the lower electrode 30 of the capacitor 35. Therefore, deterioration of the electric reliability for the peripheral circuit portion due to the formation of the lower electrode 30 can be prevented. As described above since the capacitor 35 can be formed at a low temperature process, the electric reliability of the peripheral circuit portion can be maintained even if the step of forming the capacitor 35 is conducted after the step of forming the peripheral circuit.

Further, in this embodiment, since the step of forming the bit line 27 is conducted after the circuit region processing step, it is possible to use, as the material for forming the bit line 27, tungsten that has no heat resistance to the heat treatment at high temperature for forming the compensating diffusion layer 25 but has low resistance and can be formed at a temperature not causing the junction leak at the joined portion between the diffusion layer 15 and the plug 23 in the circuit region (2). Accordingly, since the resistance of the bit line 27 can be lowered without causing failure in the bit line 27 and while maintaining the electric reliability of the peripheral circuit portion, it is possible to manufacture a semiconductor device of high reading speed, with no erroneous operation and with improved reading performance. Further, when copper having a resistance lower than that of tungsten is used as the material for forming the bit line 27, a semiconductor device with further improved reading performance can be attained.

Further, in this embodiment, since the plug 23 to be joined with the diffusion layer 15 is formed in the circuit region (2) simultaneously with the formation of the bit line 27, the number of steps can be saved compared with the prior art of forming the bit line and the plug separately. Therefore, the production yield can be improved. Accordingly, in this embodiment, it is possible to manufacture a semiconductor device comprising a DRAM having a high capacity and with improved reading performance.

Further, in this embodiment, while the bit line is formed after the heat treatment for forming the compensating diffusion layer, the bit line can also be formed before ion implantation for forming the compensating diffusion layer if a conductive material having heat resistance to the heat treatment for forming the compensating diffusion layer, for example, tungsten silicide is used as the material for forming the bit line.

Further, it will be apparent that the method of manufacturing the semiconductor device according to the present invention is not restricted only to the foregoing embodiment but the forming conditions and materials can be modified appropriately so long as it does not depart from the gist of the present invention.

As has been described above, in the method of manufacturing the semiconductor device according to the present invention, since a cell region processing step having the step for forming the capacitor is conducted after the step of forming the peripheral circuit for implanting impurities into the circuit region and applying a heat treatment at high temperature for activating the impurities, the thus formed capacitor is free from the effect of the heat treatment for the peripheral circuit forming region. Therefore, since a highly dielectric material having a worry of lowering the capacity of the capacitor by the heat treatment at high temperature can be used for the material of forming the dielectric film for the capacitor, it is possible to manufacture a semiconductor device which can ensure the capacity of the capacitor capable of effectively coping with soft errors caused by α-rays even if the area of the memory cell is reduced. Furthermore, even when the conduction portion joined with the diffusion layer is formed to the connection hole in the circuit region in the previous step of forming the peripheral circuit, if a material that can be formed at a temperature not causing the junction leak at the joined portion is used for the highly dielectric material, the electric reliability of the peripheral circuit portion can also be maintained.

Furthermore, since the cell region processing step is conducted after the step of forming the peripheral circuit, a conductive material with low resistance which could not be used so far because of the disadvantage caused by the heat treatment at high temperature can be used as the material for forming the bit line in a case of conducting the step of forming the bit line in the cell region processing step as the material for forming the bit line. Therefore, a semiconductor device with improved reading performance can be manufactured.

What is claimed is:

1. A method of manufacturing a semiconductor device using a substrate body comprising a semiconductor substrate having a cell region for forming a memory cell portion and a circuit region for forming a peripheral circuit portion in which a diffusion layer is formed to the semiconductor substrate in the circuit region and an insulation film is formed on the semiconductor substrate, the method comprising the steps of:

forming a peripheral circuit by:
   forming a connection hole to the insulation film in the circuit region for exposing the diffusion layer at the bottom,
   ion implanting impurities to the diffusion layer in the vicinity of the connection hole, and
   applying a heat treatment for activating the impurities introduced to the diffusion layer; and then
   forming a conduction portion to be joined with the diffusion layer to the conduction hole in the circuit region; and processing a cell region by forming a capacitor on the substrate body in the cell region and forming the dielectric film of the capacitor with a dielectric material that can be formed at a temperature lower than the temperature causing junction leak at a joined portion between the diffusion layer and the conductive portion.

2. A method of manufacturing a semiconductor device as defined in claim 1, wherein a material having a specific dielectric constant higher than that of silicon nitride is used for the dielectric material.

3. A method of manufacturing a semiconductor device as defined in claim 2, wherein tantalum oxide is used as the material having a higher specific dielectric constant than that of silicon nitride.

4. A method of manufacturing a semiconductor device as defined in claim 2, wherein iridium oxide is used as the material having a higher specific dielectric constant than that of silicon nitride.

5. A method of manufacturing a semiconductor device as defined in claim 2, wherein titanium oxide is used as a material having a higher specific dielectric constant than that of silicon nitride.

6. A method of manufacturing a semiconductor device as defined in claim 2, wherein cerium oxide is used as the material having a higher specific dielectric constant than that of silicon nitride.

7. A method of manufacturing a semiconductor device as defined in claim 2, wherein strontium titanate is used as the material having a higher specific dielectric constant than that of silicon nitride.

8. A method of manufacturing a semiconductor device as defined in claim 2, wherein barium strontium titanate is used as the material having a higher specific dielectric constant than that of silicon nitride.

9. A method of manufacturing a semiconductor device as defined in claim 2, wherein lanthanum lead zirconium titanate is used as the material having a higher specific dielectric constant than that of silicon nitride.

10. A method of manufacturing a semiconductor device as defined in claim 1, wherein the step of processing the cell region has a step of forming the capacitor and, in addition, a step of forming a bit line on the substrate body in the cell region.

11. A method of manufacturing a semiconductor device as defined in claim 10, wherein the method comprises
  a step of forming a conductive portion to be joined with the diffusion layer in the connection hole of the circuit region between the step of applying the heat treatment for the step of forming the peripheral circuit and a step of forming the capacitor in the step of processing the cell region, and wherein
  a conductive material that can be formed at a temperature lower than a temperature of causing junction leak to the joined portion between the diffusion layer and the conductive layer is used as a conductive material for forming a bit line.

12. A method of manufacturing a semiconductor device as defined in claim 11, wherein tungsten is used as the conductive material forming the bit line.

13. A method of manufacturing a semiconductor device as defined in claim 11, wherein
  the step of forming the bit line in the step of processing the cell region is a step to be conducted before the step of forming the capacitor, and
  a step of forming a conductive portion to be joined with the diffusion layer in the connection hole as the circuit region is conducted together in the step of forming the bit line.

14. A method of manufacturing a semiconductor device as defined in claim 13, wherein the method comprises forming a groove to the insulation film of the cell region for forming the bit line and then an identical conductive material is buried in the groove in the cell region and in the connection hole in the circuit region thereby forming the bit line and the conductive portion to be joined with the diffusion layer and using
  a material that can be formed at a temperature lower than a temperature causing junction leak to a joined portion between the diffusion layer and the conductive layer.

15. A method of manufacturing a semiconductor device using a substrate body comprising a semiconductor substrate having a cell region for forming a memory cell portion and a circuit region for forming a peripheral circuit portion in which a diffusion layer is formed to the semiconductor substrate in the circuit region and an insulation film is formed on the semiconductor substrate, the method comprising the steps of:
  forming a peripheral circuit by:
    forming a connection hole to the insulation film in the circuit region for exposing the diffusion layer at the bottom,
    ion implanting impurities to the diffusion layer in the vicinity of the connection hole, and
    applying a heat treatment for activating the impurities introduced to the diffusion layer; and then
    forming a conduction portion to be joined with the diffusion layer in the conduction hole in the circuit region;
  processing a cell region by forming a capacitor on the substrate body in the cell region;
  applying other heat treatment; and
  forming a lower electrode of the capacitor with a conductive material which can be formed at a temperature lower than the temperature causing junction leak to a joined portion between the diffusion layer and the conduction portion.

16. A method of manufacturing a semiconductor device as defined in claim 15, wherein the method comprises
  forming a lower electrode main body with a first conductive material that can be formed at a temperature lower than a temperature of causing junction leak to the joined portion upon forming the lower electrode of the capacitor and then covering the surface of the lower electrode main body with a second conductive material thereby forming the lower electrode, in which
  a conductive material that can be formed at a temperature lower than a temperature of causing the junction leak to the joined portion, and suppress oxidation on the surface of the lower electrode main body thereby maintaining the capacity of the capacitor formed in the step of processing the cell region upon heat treatment after forming the dielectric film of the capacitor and the step of processing the cell region, thereby and maintaining the capacity of the capacitor forward in the cell region processing step is used as the second conductive material.

17. A method of manufacturing a semiconductor device as defined in claim 16, wherein the first conductive material is tungsten and the second conductive material is tungsten nitride.

18. A method of manufacturing a semiconductor device using a substrate body comprising a semiconductor substrate having a cell region for forming a memory cell portion and a circuit region for forming a peripheral circuit portion in which a diffusion layer is formed to the semiconductor substrate in the circuit region and an insulation film is formed on the semiconductor substrate, the method comprising the steps of:

forming a peripheral circuit by:

forming a connection hole to the insulation film in the circuit region for exposing the diffusion layer at the bottom, ion implanting impurities to the diffusion layer in the vicinity of the connection hole, and applying a heat treatment for activating the impurities introduced to the diffusion layer; and then forming a conduction portion to be joined with the diffusion layer in the conduction hole in the circuit region;

processing a cell region by forming a capacitor on the substrate body in the cell region;

applying other heat treatment; and forming a lower electrode of the capacitor with a conductive material which can maintain the capacity of the capacitor to be formed in the step of processing the cell region upon forming the dielectric film of the capacitor conducted after forming the lower electrode and maintain the capacity of the capacitor formed in the step of processing the cell region upon heat treatment after the step of processing the cell region.

* * * * *